United States Patent [19]

Rothman et al.

[11] 4,272,561
[45] Jun. 9, 1981

[54] HYBRID PROCESS FOR SBD METALLURGIES

[75] Inventors: Laura B. Rothman, Sherman, Conn.; Paul A. Totta, Poughkeepsie; James F. White, Newburgh, both of N.Y.

[73] Assignee: International Business Machines Corporation, Armonk, N.Y.

[21] Appl. No.: 43,416

[22] Filed: May 29, 1979

[51] Int. Cl.³ .................. H01L 21/283; H01L 29/48
[52] U.S. Cl. .................................... 427/84; 156/643; 156/650; 427/88; 427/89; 427/96; 427/259; 430/314; 430/315
[58] Field of Search ................. 156/643, 650; 427/88, 427/89, 259, 84, 96; 430/314, 315

[56] References Cited

U.S. PATENT DOCUMENTS

| | | | |
|---|---|---|---|
| 2,559,389 | 7/1951 | Beeber et al. | |
| 3,873,361 | 3/1975 | Franco et al. | 427/259 |
| 4,004,044 | 1/1977 | Franco et al. | 427/259 |
| 4,045,318 | 8/1977 | Himies et al. | |
| 4,070,501 | 1/1978 | Corbin et al. | 156/643 |
| 4,076,575 | 2/1978 | Chang | 427/259 |
| 4,088,490 | 5/1978 | Duke et al. | 427/259 |
| 4,132,586 | 1/1979 | Schaible et al. | 156/643 |

OTHER PUBLICATIONS

Fredericks et al., "Polysulfone Lift-Off Masking Technique", IBM TDB, vol. 20, No. 3, p. 989, Aug. 1977.
Logan et al., "Planar Metal Interconnections by Back-filled Quartz", IBM TDB, vol. 21, No. 12. p. 4865–4866, May 1979.
Dalsl et al., "Chrome–Copper–Chrome Lift Off Process", IBM TDB, vol. 20, No. 8, p. 3080, Jan. 1978.
Bergeron, "Double Lift Off Via Interconnection and Passivation Process", IBM TDB, vol. 21, No. 4, p. 1371, Sep. 1978.

*Primary Examiner*—John D. Smith
*Attorney, Agent, or Firm*—Henry Powers

[57] ABSTRACT

A method for forming thin film patterns in the fabrication of integrated circuits utilizing a lift-off mask in an inverse vertical relationship with the desired metal film. The method involves the preliminary blanket deposition of the metal in-point, followed by a coating of a patterned lift-off mask over which is blanket coated a dry-etch resistant material with subsequent removal of the lift-off mask, and dry etching of the exposed metal film. In one embodiment the dry-etch mask can comprise a diverse metal layer when a dry-etch ambient is employed which is passive to the diverse metal. In another embodiment, where dry etch ambients are employed which are corrosive to the diverse metal which is desired in the final structure, it can be covered with a blanket layer of any convenient dry-etch resistant material, such as magnesium oxide, prior to removal of the lift-off mask. This method has effective application in the fabrication of Schottky barrier diodes, transistors, and other electronic components or discrete and integrated devices requiring high quality metal to semiconductor junctions or interfaces.

25 Claims, 6 Drawing Figures

HYBRID PROCESS FOR SBD METALLURGIES

DESCRIPTION

1. Technical Field

This invention relates to a method of depositing thin films, particularly thin films such as metallic films, in the fabrication of integrated circuits.

One object of the present invention is to provide an improved method for depositing thin films.

Another object of the present invention is to provide an improved lift-off method for depositing thin films on a substrate without contact of a lift-off mask with a substrate.

Another object of this invention is to provide a lift-off method for fabrication of a metal-semiconductor interface with minimization of contamination therebetween by a lift-off mask during processing.

Still another object of this invention is to provide an improved process for forming metallization in the fabrication of semiconductor devices utilizing a lift-off mask technique with a dry-etch mask which enables subtractive dry-etching of the metallization to retain desired portions thereof on a substrate.

2. Background Art

In the continued miniaturization of semiconductor integrated circuits, the metallization of such devices is receiving continuing attention as a significant stage in achieving greater component density and smaller units in large scale integrated circuitry. One method for forming such metallization is commonly denoted by the term "expendable mask method", "lift-off method" or "stencil method", which was initially described in U.S. Pat. No. 2,559,389. Improvements to the basic "lift-off method" have been made, as for example, in U.S. Pat. Nos. 3,849,136, 3,873,361 and 4,004,044.

This "lift-off" method includes the use of organic polymeric material deposited as a sub-layer on an integrated circuit substrate and an overlying layer of a diverse material, such as a metal, silicon dioxide, a polydimethylsiloxane, having openings in a selected pattern. Corresponding openings are conventionally formed in the polymeric material, of the sub-layer, by dry-etching, e.g. reactive sputter etching, utilizing the overlying layer as a dry etch mask. The desired thin film to be deposited, is then applied over the structure and on the surface of the substrate exposed by the openings in polymeric material.

When the polymeric material is removed by application of a solvent selective for it, the overlying layer and the thin film, above the masking layer, "lift-off" to leave the thin film deposit in the selected pattern on the substrate.

However, although lift-off techniques have achieved success in the fabrication of integrated circuits, they are nevertheless characterized with the objectionable deposition of a solvent soluble polymer directly on the oxidized silicon substrate inclusive of the silicon substrate exposed through via holes in the oxide. Since this organic lift-off mask component is applied on the surface, special precautions are required for complete removal of the lift-off mask components. Since it is extremely difficult to insure complete removal of trace amounts of the lift-off mask, the retention of such trace amount comprise contamination of the surfaces with accompanying loss in yield in the fabrication of semiconductor devices.

It has been discovered, in accordance with this invention that contamination of silicon surfaces by organic components of lift-off masks can be eliminated by a novel and improved lift-off process wherein the desired metallurgy can be deposited directly on a clean silicon surface.

BRIEF DESCRIPTION OF THE DRAWINGS

In the accompanying drawings forming a material part of this disclosure.

DISCLOSURE OF THE INVENTION

Figure 1:
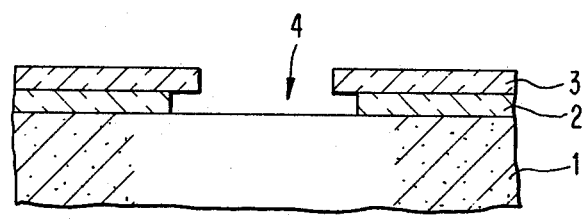
FIGS. 1 to 6 are diagrammatic cross-sectional views illustrating a portion of a substrate at various stages of processing during the practice of the method of this invention.

For further comprehension of the invention, and of the objects and advantages thereof, reference will be had to the following description and accompanying drawings, and to the appended claims in which the various features of the invention are more particularly set forth.

Briefly, the improved lift-off process of this invention involves the initial deposition (e.g. by sputtering or vacuum evaporation) of the desired thin film metallurgy of desired thickness directly on a substrate.

Although the invention has wide application, it has specific and immediate interest to the fabrication of semiconductor devices formed in an oxidized monocrystalline silicon substrate having contact via holes in the oxide for access to underlying portions of the substrate. The semiconductor devices can be Schottky Barrier Diodes (SBD), transistors and other electronic components or discrete and integrated devices requiring high quality metal to semiconductor junctions or interfaces. In such applications, the thin film metallurgy can comprise conductive metals, such as aluminum based metals, for an interconnection network and ohmic contacts, as well as Schottky barrier diode metallurgy such as Ta, TiW and the like.

After the thin film deposition, it can be overcoated with any of the well known lift-off masks structures, since the substrate is already protected by the thin film against the lift-off mask components. In an illustrative embodiment, the thin film is overcoated with a blanket layer, e.g. the first layer component of a lift-off mask, of a material, such as an organic polymer (which in a preferred form can comprise a polysulfone, which is amenable to reactive ion etching in an $O_2$ ambient), that is soluble in a solvent that is substantially passive to other components employed in delineation of the thin film. This can be followed by overcoating the sub-base with cover layer, e.g. the second component layer of a lift-off mask, of a material, e.g. SiO, which is resistive to reactive ion etching in an oxygen containing ambient. The cover layer is then overcoated with a blanket layer of a photo or electron-beam resist, which is patterned, using standard photo or electron beam lithographic techniques, to expose portions of the cover layer (e.g. the second component of the lift-off mask) in a pattern corresponding to the metallurgy patterns desired. Using the patterned resist as a masking layer, an opening is suitably formed in the cover layer, as for example by reactive ion etching utilizing any suitable ambient, which for silicon monoxide can comprise a carbontetrafluoride ($CF_4$) ambient.

This is normally followed by suitable etching of conforming openings in the lift-off mask sub-base, as for example, again by reactive ion etching in the same sputtering chamber in which, for a polysulfone base, the ambient can be switched, with purging to an oxygen containing atmosphere to which silicon monoxide is comparatively resistant. As will be appreciated, the provision of the indicated conforming openings in lift-off sub-layer exposes as corresponding pattern of the deposited thin film.

Resist is removed coincidentally by O₂ RIE etching of "polysulfone" layer. After removal of the resist layer (which may be concurrently with O₂ RIE etching of the polysulfone layer), a blanket layer of a conductive metal, for example, aluminum based alloy such as a 96/4 aluminum/copper alloy, is deposited (e.g. by sputtering or vacuum deposition) over the lift-off mask top component, e.g. SiO, as well as over the exposed portions of the thin film. In an optional step, where required and/or necessary, the conductive metal layer can be blanket coated with a dry etch mask (such as magnesium oxide (MgO) described in U.S. Pat. No. 4,132,586. This is followed by exposing the substrate to a solvent that is selective to the lift-off mask sub-base. On dissolution of the sub-base component, all superimposed films and layers will lift-off to expose the remaining portions of the thin-film not covered by the conductive metal layer and its top cap of dry etch mask e.g. MgO. The exposed thin film can then be removed as by reactive ion etching which for Schottky Diode barrier metallurgy such as Ta, TiW and the like, would include an ambient comprised of CF₄. In the final operation, the dry etch top cap is removed, as for example in oxalic acid if the top cap is formed of MgO.

As indicated the application of the dry-etch mask (e.g. MgO) is optional and can be omitted where the reactive ion etching operation can be adapted (e.g. by a catcher plate) to suppress the redeposition of the conductive metal layer.

Also, although reactive ion etching has been specifically referred to, it is to be understood that other dry etching techniques, such as discussed in U.S. Pat. No. 4,132,586, can also be employed where applicable.

BEST MODE FOR CARRYING OUT THE INVENTION

Referring to FIG. 1, in particular, there is shown a substrate 1 which in an illustrative application is comprised of monocrystalline silicon which is normally oxidized to provide overlying dielectric layer 2 as for example of silicon dioxide, and optionally where required, and as shown an overcoating 3 of silicon nitride, or other supplementary dielectric. The substrate 1 in the preferred embodiment is directed to the fabrication of semiconductor devices; and thus the substrate is comprehended to comprise an integrated circuit having active and passive devices fabricated therein (not shown) and means for electrically isolating the devices from each other. Also, although the invention disclosed herein has broad application, inclusive of the fabrication of ohmic contacts and interconnection metallurgy (as described in the above noted patents), the invention will be specifically described with reference to the fabrication of Schottky Barrier Diodes (SBD).

In such application the dielectric layer 2 will have a number of contact openings or via holes 4 for making contact to active and passive devices as well as for the fabrication of Schottky Barrier Diodes on the surface of the silicon substrate 1. Also, it is to be understood that the substrate could also be a body of insulating material when the process is used to form metallurgy on a module or carrier (e.g. a ceramic or glass-ceramic substrate) for supporting integrated circuit devices and appropriate associated circuitry.

Figure 2:
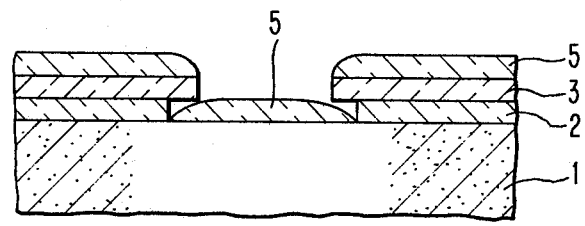

Next a functional metallic film 5, typically of about 500 to about 2000 Angstroms thickness is deposited, by sputtering or vacuum-evaporation, over the substrate and on the silicon surface (as through via hole 4) as shown in FIG. 2. This metallic film may be any metal conventionally used for integrated circuit metallization, e.g. aluminum, aluminum-copper alloys, platinum, palladium, molybdenum, tantalum or laminated combinations such as chromium-aluminum alloys, chrome-copper-chrome, chromium-silver-chromium, molybdenum-gold-molybdenum, and the like. As will be appreciated, for the fabrication of Schottky Barrier Diodes, the metal film can be Ta, TiW or other SBD metallurgy of required and conventional thickness, which in a specific example, can comprise a 1200 Å sputtered blanket layer of TiW. A suitable tool for the sputtering operation is the Perkin-Elmer Ultek 4400 Production Sputtering System.

Figure 3:
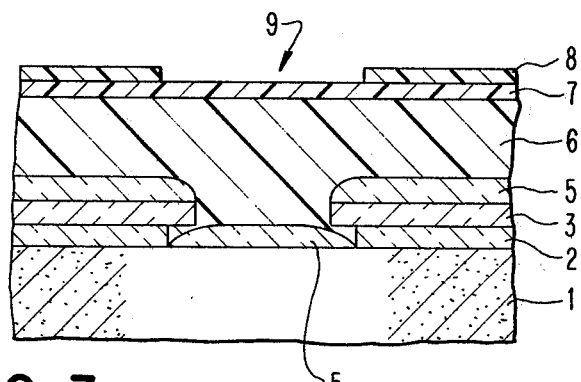

Next as shown in FIG. 3, a blanket layer 6 of a solvent soluble organic polymer, illustratively in a thickness range of 5000 to 20,000 microns, is deposited over the metallic film 5. Various suitable solvent soluble polymers can be used as for example the polysulfone polymerized resin, many of which are described in U.S. Pat. No. 4,045,318. A typical polysulfone resin is sold under the trademark "ASTREL 360" by the 3M Company.

Another effective polymer for specific use in this embodiment is a conventional photo resist such as the AZ-1350 type distributed by the Shipley Corporation, and which comprises a novolac-type phenol-formaldehyde resin and a photosensitive cross-linking agent. When this photoresist material (e.g. AZ-1350) is baked at about 210° C. to improve adhesion, to the metal film 5, the photoresist is rendered thermally stable as well as non-photosensitive. The resist can be applied by any of the well known techniques such as spinning, brushing, dipping and the like. For the fabrication of SBD's herein, the AZ-1350 resist was applied by spinning as a blanket coating of about 20,000 Å thickness, and in another example the polysulfone polymer was applied as a blanket coating of about 20,000 Å thickness.

Next a blanket layer 7 of a relatively thin masking material is deposited over the solvent soluble layer 6, with masking layer 7 preferably comprised of a material which is resistive to reactive ion etching in oxygen containing ambient. The masking layer can comprise SiO, Al₂O₃, Si, Si₃N₄ or a metal layer. Another effective material, for the masking layer 7, is a glass resin such as the polymethysiloxanes such as the "type 650" sold by Owens Illinois. These glass resins can be applied from solution by spinning to form a layer of about 1500 A to about 4000 Å thick, followed by curing in a nitrogen ambient of about 210° C. for about 10 to 15 minutes.

In one example, about 1000 Å thick layer 7 of SiO was deposited on a polysulfone layer 6, and in another example about 2500 Å thick layer of the resin glass "type 650" was formed as a masking layer 7, on an AZ-1350 resist sub-layer 6.

Also as shown in FIG. 3, a layer 8 of a photo or electron beam resist, such as "AZ-1350" is blanket-coated over mask layer 7 where it is comprised of SiO or glass resin. Openings 9 are then formed in resist layer 8 by conventional lithographic techniques such as used in the integrated circuit fabrication art.

The exposed and patterned resist layer 8 is used as a mask for removal of the exposed portion of layers 6 and 7 by any suitable technique such as dip etching and the like, and preferably by reactive ion etching.

In reactive ion etching, the structure of FIG. 3 is placed into an R.F. sputtering chamber, such as described in U.S. Pat. No. 3,598,710, wherein for glass-resin and silicon oxide masking layers 7, the ambient will at least include $CF_4$. For glass-resin layers the ambient will include $CF_4$ at a pressure of 20 millitorrs and a power density of about 0.15 watts/cm$^2$, whereas for a silicon oxide mask layer 7, it will be etched in a $CF_4$ containing ambient at a pressure of about 100 millitorrs and a power density of 0.15 watts/cm$^2$. Thus the openings 9 in the resist pattern are transferred into a corresponding opening through the mask layer 7. As indicated above, the resist layer 8 can conveniently be removed concurrently with the etching of layer 6.

Utilizing the exposed layer 7 with the openings formed therein as a mask, the polymeric sub-layer 6, is then apertured by reactive ion etching in an oxygen containing ambient. For a polysulfone sublayer 6, the etching can be accomplished at a pressure of 100 millitorrs of $O_2$ at a power density of 0.25 watts/cm$^2$, whereas of a "AZ-1350" resist sub-layer 6, the etching can be effected at a pressure of about 100 millitorrs of $O_2$ at a power density of about 0.25 watts/cm$^2$. Alternatively, the ambient could consist of $O_2$ in combination with an inert gas such as argon, nitrogen and the like. Also, although reactive ion etching has been specifically referred to, it is to be understood that any dry etching technique can also be employed, such as indicated in U.S. Pat. No. 4,132,586.

Figure 4:
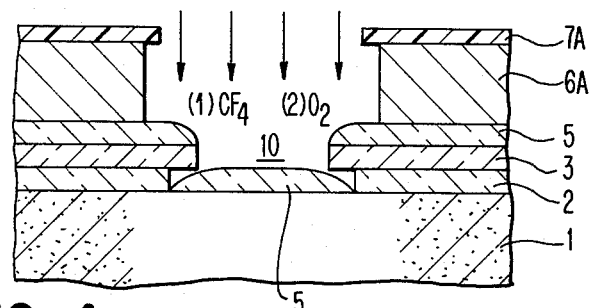

The successive reactive ion sputter etching steps undertaken in accordance with the steps associated with FIG. 4 can be conveniently accomplished in the same reactive sputter etching chamber utilizing first a fluorine containing gas ambient (for mask layer 7) followed by purging and substitution of an oxygen containing gas ambient (for the sublayer 6).

Figure 6:
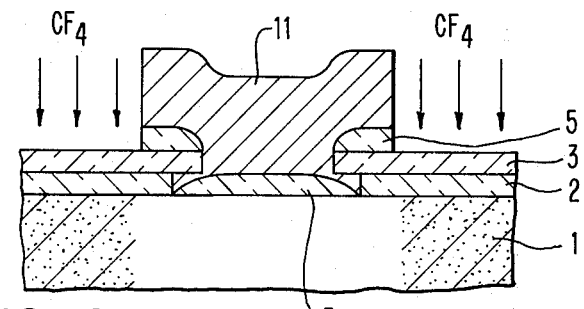

Next using the lift-off composite 6A/7A, of FIG. 4, with opening 10 as a mask, a diverse metal or a dry etch mask material is blanket-coated over the structure of FIG. 4. In the fabrication of Schottky Barrier Diodes, this blanket coating can comprise a suitable conductive metal, such as a 96/4 Al/Cu alloy, which can be used as an ohmic contact 11 of the SBD (FIG. 6). Alternatively if the basic metal film 5 is to comprise an ohmic contact or an interconnection pattern, the structure can be blanket-coated with a dry etch resist material such as magnesium oxide of U.S. Pat. No. 4,132,586.

Also for fabrication of Schottky Barrier diodes, where the metal film is susceptible to oxidation which could give rise to high electrical resistance and/or dielectric breakdown, in the final structure the oxide film can be removed by an insitu sputter etch cycle prior to ohmic contact deposition step.

In the next operation, utilizing conventional lift-off removal techniques, the sub-layer (and all of the overlying layers) are then removed by exposing the substrate to a solvent for the material of the polymeric sub-layer 6. Where the polymeric layer is either a polysulfone polymer or the "AZ-1350" resist, a typical solvent is n-methyl pyrrolidone at 60°-100° C. Any suitable solvent can be used which dissolves or swells the polymeric material of layer 6 without affecting the thin film 5. Such solvents include acetone, isopropanol, methyl ethyl ketone or trichloroethylene. The solvents used to dissolve the polymeric material may be the same solvent used in applying the polymer coating 6.

Figure 5:
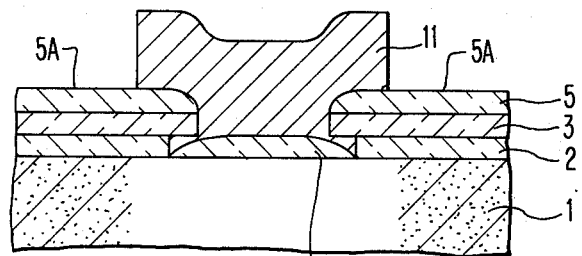

In the final operation, as shown in FIG. 6, using the Al/Cu ohmic contact 11 as a dry etch mask, the exposed portions 5A (see FIG. 5), of the thin film 5, is then suitably removed, which in the preferred form will employ reactive ion etching, which as for example, for a Ti/W or Ta thin film 5 would be in a $CF_4$ containing ambient. For a Ti/W thin film, the etching would be at a pressure of about 20 millitorrs and a power density of about 0.15 watts/cm$^2$. The final structure would be as shown in FIG. 6.

In a variation, where the diverse metal layer, e.g. ohmic contact metallurgy 11, such as an Al-Cu alloy, may be exposed in an erosive reactive ion etching ambient, the structure may be coated with a blanket layer of a dry etch masking material, such as magnesium oxide prior to the lift-off operation. Accordingly, on removal of the lift-off mask, a dry etch mask will be retained on the ohmic contact to protect it during etching of the exposed portions 5A of thin film 5. The dry etch mask can then be finally removed, in any suitable manner, which for magnesium oxide can comprise exposure to oxalic acid.

While the invention has been illustrated and described with respect to preferred embodiments, it is to be understood that the invention is not to be limited to the precise constructions herein disclosed and the right is reserved to all changes and modifications coming within the scope of the invention as defined in the appended claims.

Having thus described the invention, what is claimed as new, and desired to be secured by Letters Patent is:

1. A lift-off method for forming a metallic film on a substrate comprising:
   (a) depositing a blanket coating of a metal film on said substrate;
   (b) depositing a blanket film of a solvent soluble organic polymer on said metal film,
   (c) depositing a blanket film of a masking material on said polymeric film,
   (d) forming a predetermined pattern of openings through said masking and polymeric films to expose corresponding portions of said metal film,
   (e) depositing an etch resistant blanket layer of a diverse conductive metal, which is inert to said solvent, over said masking and exposed portions of the first said metal film,
   (f) subjecting the components structure to said solvent to solvate said polymeric film and concurrently lifting-off all superimposed films thereon and expose underlying portions of the first said metal film, and
   (g) removing the said underlying exposed portions of said metal film.

2. The method of claim 1 wherein said substrate is an oxidized monocrystalline silicon semiconductor substrate having at least one via hole in the oxide film in register with a corresponding one of said openings to expose surface adjacent portion of said silicon substrate, with said substrate having at least one integrated circuit formed therein, and said metal film is in contact with the exposed portions of said substrate.

3. The method of claim 2 wherein the first said metal film is a Schottky Barrier metal.

4. The method of claim 3 where said polymeric material is a polysulfone.

5. The method of claim 4 wherein said masking film is silicon oxide.

6. The method of claim 5 wherein said second metal is an ohmic contact metal.

7. The method of claim 5 wherein said second metal comprises is a dry etch mask, and said exposed metal is removed by dry etching.

8. The method of claim 2 wherein said polymeric material is a polysulfone.

9. The method of claim 8 wherein said masking film is silicon monoxide.

10. The method of claim 1 wherein said second metal layer comprises a dry etch mask, and said exposed underlying first metal is removed by dry etching in an ambient relatively passive to said second metal.

11. A lift-off method for forming a patterned metallization on a dielectric coated monocrystalline silicon substrate having at least one via hole in the first said dielectric to expose surface adjacent portions of said silicon substrate, with said substrate having at least one integrated circuit formed therein, said method comprising:
(a) depositing a blanket coating of a metal film on said dielectric and the said exposed portions of said substrate,
(b) depositing a blanket film of a solvent soluble organic polymer on said metal film,
(c) depositing a blanket film of a masking material on said polymeric film,
(d) forming a predetermined pattern of openings through said polymeric and masking films in register with a said via hole to expose corresponding portions of said metal film thereat,
(e) depositing a second diverse conductive metal layer over said masking film and on exposed portions of said metal film,
(f) subjecting the composite substrate to said solvent to solvate said polymeric film and concurrently lifting off all superimposed deposits thereon and expose underlying portions of the first said metal film,
(g) dry etching the said exposed portions of said metal film in an ambient relatively passive to said second metal layer.

12. The method of claim 12 wherein said metal film is a Schottky barrier contact metal.

13. The method of claim 12 wherein said polymeric material is a polysulfone.

14. The method of claim 13 wherein said masking film is silicon monoxide.

15. The method of claim 11 including depositing a dry etch resistant material inert to said solvent over said second metal layer prior to step g, and removing said dry etch resistant material from the retained portions of said second metal layer after step g.

16. The method of claim 15 wherein said dry etch resistant material is magnesium oxide.

17. A method for forming a patterned metal coating on an oxidized monocrystalline silicon substrate having at least one via hole in said oxide to expose surface adjacent portions of said substrate, and with said substrate having at least one integrated circuit formed therein, comprising:
(a) depositing a blanket coating of a Schottky barrier metal film over the oxidized surface and said exposed portions of said substrate,
(b) depositing a blanket film of a solvent soluble polysulfone polymer over said metal film, with said polymeric film being subject to reactive ion etching in oxygen,
(c) depositing a second blanket layer of silicon monoxide over said polysulfone film,
(d) depositing a resist layer over said silicon monoxide layer; exposing and developing the resist to form a pattern of openings in register with corresponding ones of said via holes, and expose therebetween the corresponding portions of said silicon monoxide layer,
(e) reactive ion etching in ambient comprised of $CF_4$ the exposed portions of said silicon monoxide layer, to expose the underlying portions of said polysulfone polymer,
(f) reactive ion etching in an ambient comprised of oxygen, the exposed portions of said polysulfone polymer to expose the underlying portions of said metal film,
(g) depositing a blanket layer of an ohmic contact metal over said substrate and over said exposed portions of said metal film,
(h) subjecting said composite structure to said solvent to solvate said polysulfone polymer and concurrently lift-off all superimposed deposits thereon and expose the underlying portions of the first said metal film, and
(i) dry etching the last said exposed portions of said metal film in an ambient relatively passive to said ohmic contact metal.

18. The method of claim 17 including the step of removing the remaining portions of said resist layer before Step g.

19. The method of claims 17 or 18 including the steps of:
(a) depositing a blanket layer of magnesium oxide over said ohmic contact layer between Steps g and h, and
(b) removing remaining portions of said magnesium oxide layer after Step i.

20. A lift-off method for forming a patterned metallic film on a substrate comprising,
(a) depositing a blanket coating of a metal film on said substrate,
(b) forming a lift-off mask on said metal film, having a pattern of openings over desired portions of said metal film,
(c) depositing a blanket diverse metal layer over said mask and said metal film portions, with said layer being inert during subsequent dry etching of said metal film,
(d) removing said mask to expose portions of said metal film not coated with said metal layer, and
(e) dry etching said exposed metal film portions in an environment substantially passive to said metal layer.

21. The method of claim 20 including depositing a blanket layer of a dry etch mask prior to Step d, and removing said dry etch mask after Step e.

22. The method of claim 21 wherein said dry etch mask is magnesium oxide.

23. The method of claim 20 wherein said substrate is an oxidized monocrystalline silicon substrate having at least one via hole in the oxide film to (a) expose surface adjacent portions of said substrate, and (b) in register with corresponding ones of said openings, (c) with said substrate having at least one integrated circuit formed therein, and (d) with said metal film in contact with said exposed surface portions.

24. The method of claim 23 wherein said metal film comprises a Schottky barrier metal, and said metal layer comprises an ohmic contact on said metal film.

25. The method of claim 24 wherein said lift-off mask comprises sequential layers of a polysulfone polymer and silicon monoxide on said metal film with said metal layer deposited on said silicon dioxide.

* * * * *